United States Patent [19]
Aritome et al.

[11] Patent Number: 5,172,198
[45] Date of Patent: * Dec. 15, 1992

[54] MOS TYPE SEMICONDUCTOR DEVICE

[75] Inventors: Seiichi Aritome; Riichiro Shirota, both of Kawasaki, Japan

[73] Assignee: Kabushiki Kaisha Toshiba, Kawasaki, Japan

[*] Notice: The portion of the term of this patent subsequent to Jul. 9, 2008 has been disclaimed.

[21] Appl. No.: 726,816

[22] Filed: Jul. 8, 1991

Related U.S. Application Data

[63] Continuation of Ser. No. 481,200, Feb. 20, 1990, Pat. No. 5,031,011.

[30] Foreign Application Priority Data

Feb. 22, 1989 [JP] Japan .................. 1-42403

[51] Int. Cl.$^5$ ................. H01L 29/68; G11C 17/00
[52] U.S. Cl. .................. 257/315; 365/184; 365/185; 257/390; 257/648
[58] Field of Search .............. 357/23.5, 52, 68, 74, 357/65; 365/184, 185, 103, 104

[56] References Cited

U.S. PATENT DOCUMENTS

| | | | |
|---|---|---|---|
| 4,451,904 | 5/1984 | Sugiura et al. | 357/23.5 |
| 4,477,883 | 10/1984 | Wada | 357/23.5 |
| 4,783,766 | 11/1988 | Samachisa et al. | 365/185 |
| 4,903,086 | 2/1990 | Hackley | 357/52 |
| 5,031,011 | 7/1991 | Aritome et al. | 357/23.5 |

Primary Examiner—Rolf Hille
Assistant Examiner—Tan Ho
Attorney, Agent, or Firm—Oblon, Spivak, McClelland, Maier & Neustadt

[57] ABSTRACT

A MOS type semiconductor device includes two adjacent MOSFETs. The FETs are respectively formed on element forming areas of a P-type substrate. Each of the transistors has N+ type layers serving as the source and drain thereof and they have a common gate electrode layer. Each of the FETs has a contact hole formed in one of the N+ type layers. A wiring layer is to be connected to the contact hole. A P+ type heavily doped semiconductor layer substantially intersects the common gate electrode layer between the FETs in the substrate. The layer functions as an inversion prevention layer. The inversion prevention layer projects from the common gate electrode layer towards the contact hole. The common gate electrode layer has a concave portion in an area of intersection with the inversion prevention layer, whereby an effective projection distance of the inversion prevention layer is increased while an opposition distance between the front edge of the inversion prevention layer and the contact hole section is kept from being set to be less than a previously required value.

3 Claims, 4 Drawing Sheets

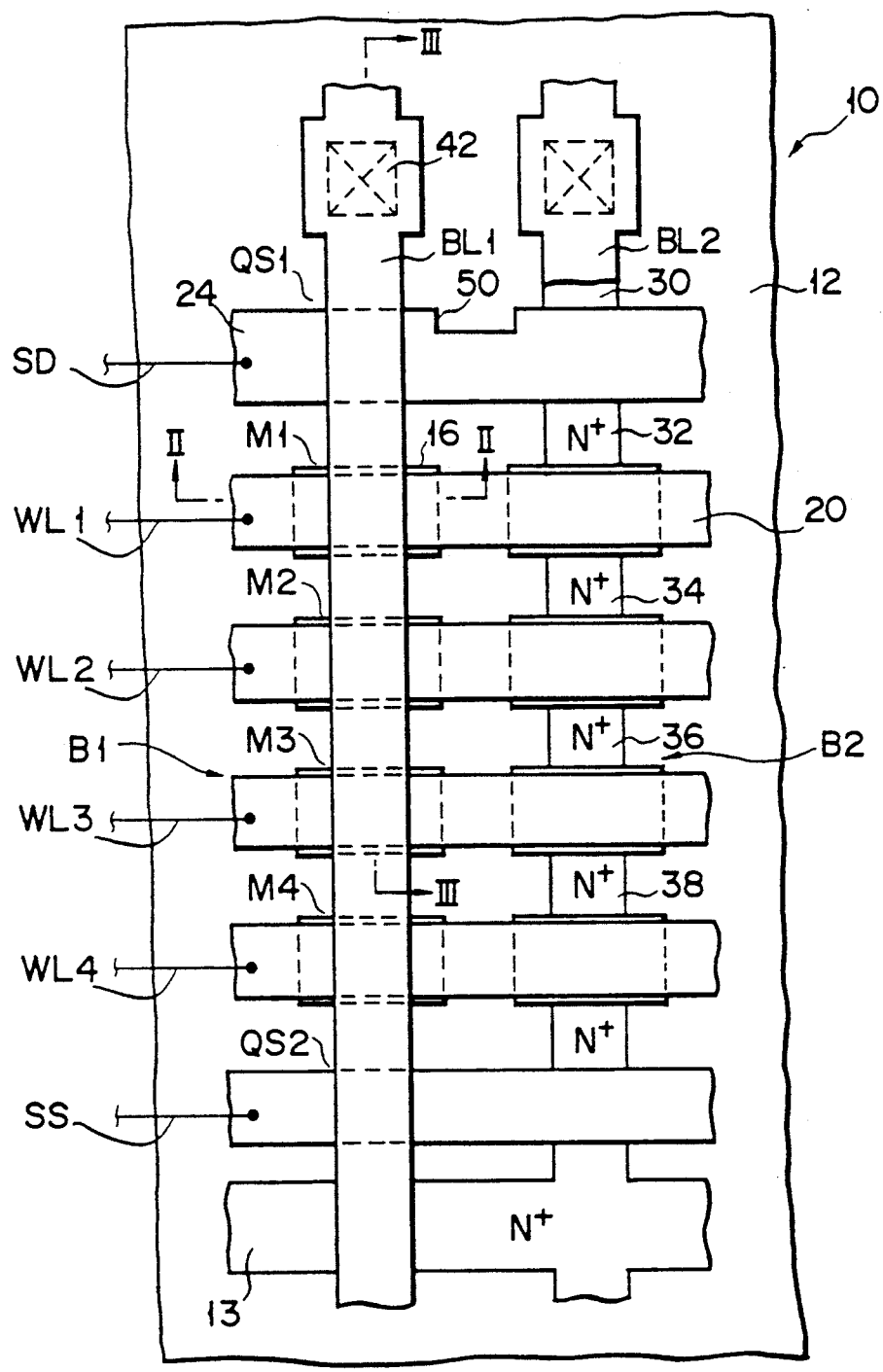
F I G. 1

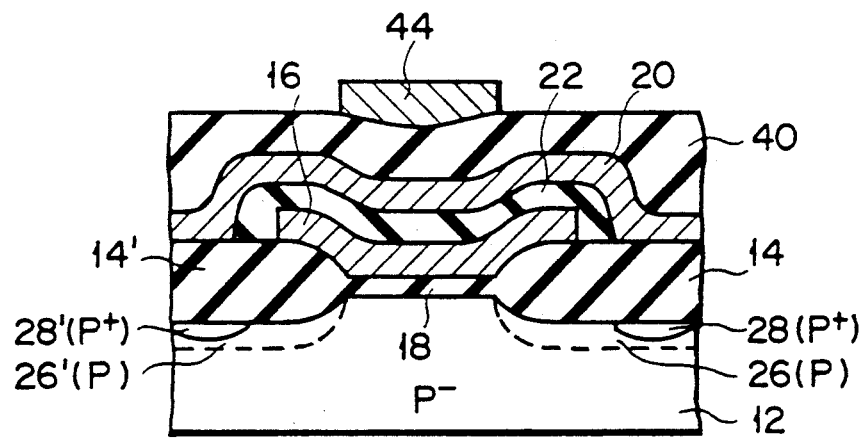
F I G. 2
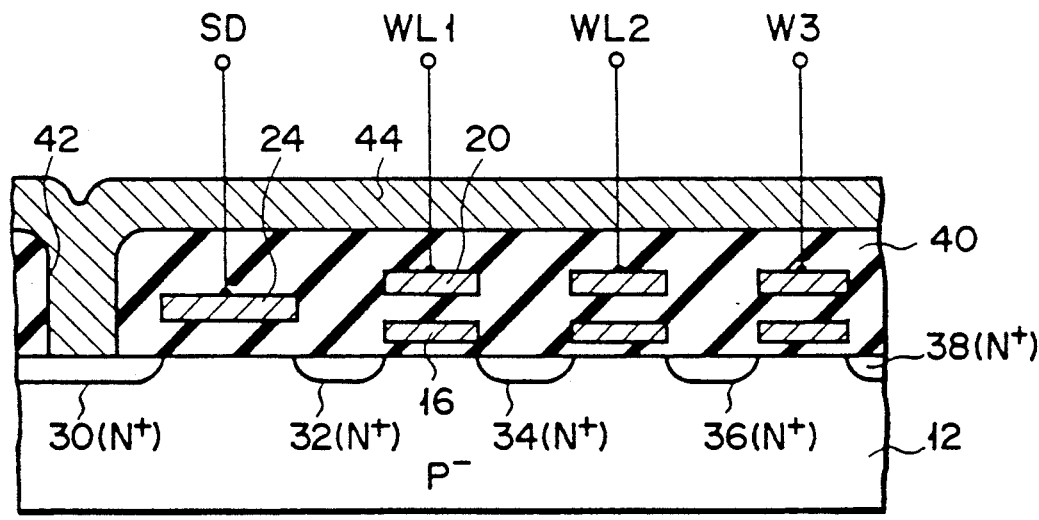
F I G. 3

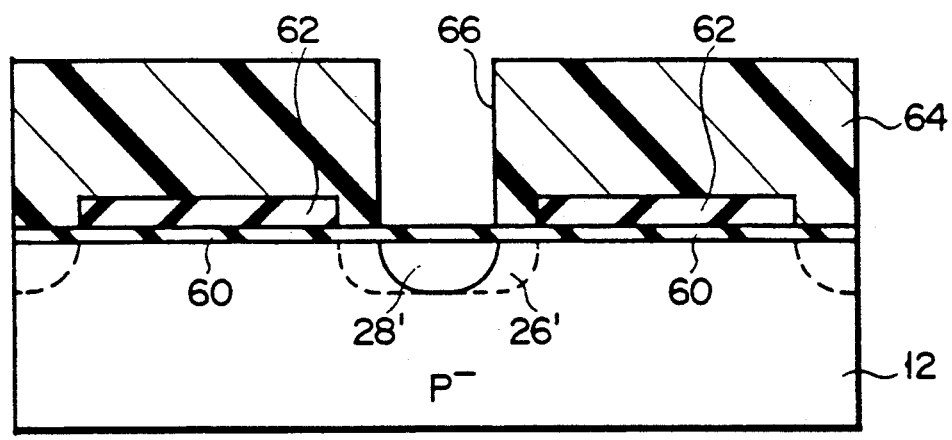
F I G. 6A
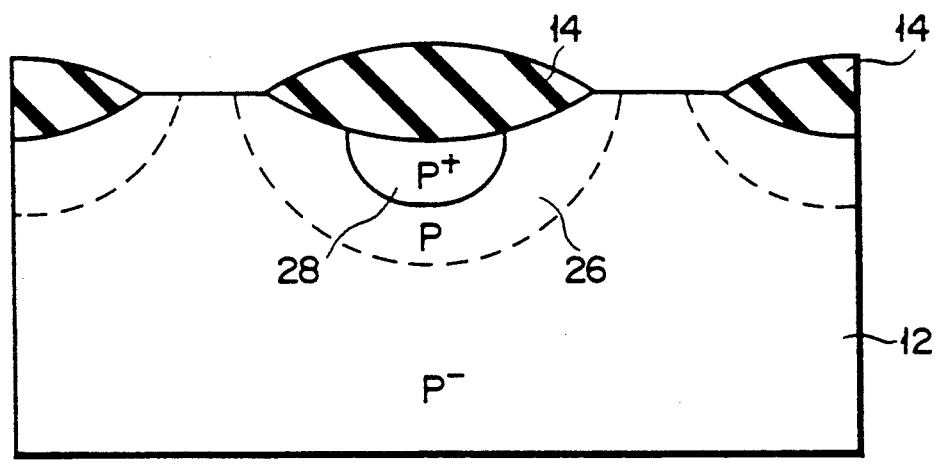
F I G. 6B
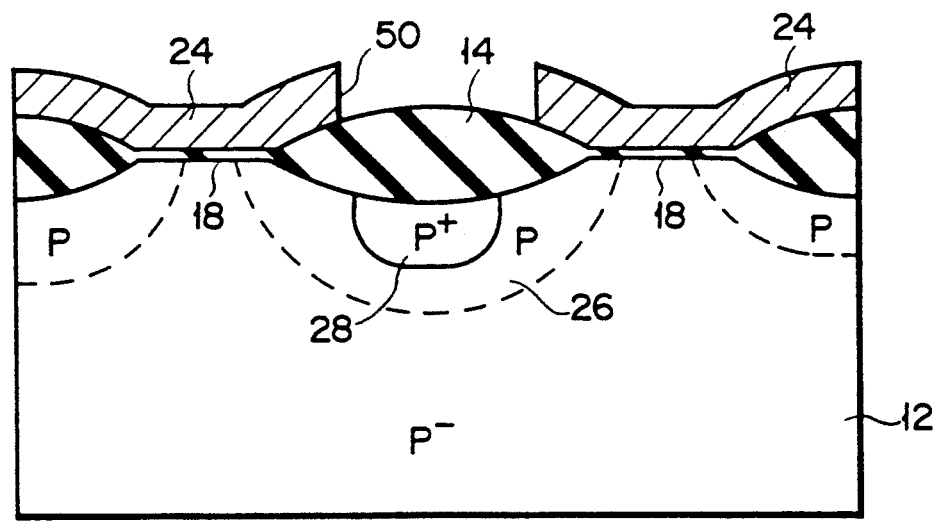
F I G. 6C

MOS TYPE SEMICONDUCTOR DEVICE

This is a continuation of application Ser. No. 07/481,200, filed on Feb. 20, 1990, now U.S. Pat. No. 8,031,011.

BACKGROUND OF THE INVENTION

1. Field of the Invention

This invention relates to semiconductor memory devices, and more particularly to MOS type semiconductor devices having a heavily doped impurity layer for inversion prevention formed in an element isolation region of a semiconductive substrate.

2. Description of the Related Art

With the increasing needs for high speed logic performance of digital systems, semiconductor memory devices formed with high integration density to have large capacity of memory space have received a great deal of attention. Typically, a semiconductor memory formed with high integration density has memory cells formed of metal-oxide semiconductor field effect transistors (MOSFETs). In order to enhance the integration density of the memory devices, the elements are formed in the finest permissible pattern. However, the this type of MOS type semiconductor devices presently available have various problems concerning the performance and reliability caused by micro-fabrication of the memory elements. Particularly, accomplishment of the compatibility of effective isolation between the elements and enhanced junction withstanding (breakdown) voltage may be one of the most important technical subjects which should be solved as soon as possible by the semiconductor manufacturers.

In the micro-fabrication of memory elements, effective isolation between the elements and enhanced junction withstanding voltage are dealt as conflict factors. As will be described hereinafter, it is not easy to accomplish the compatibility of effective isolation between the elements and enhanced junction withstanding (breakdown) voltage.

For example, in electrically erasable programmable read only memories, NAND type memory cells respectively connected to adjacent bit lines on a substrate are constructed by a series-connection of double gate type MOSFETs. Each of the NAND type memory cells is connected to a corresponding bit line via a selection transistor. A heavily-doped impurity layer is generally disposed as an element isolation layer between the adjacent selection transistors. The element isolation layer extends in parallel with the bit lines. A common gate electrode layer of the selection transistors is disposed insulatively above the substrate to intersect the bit lines.

With such an arrangement, in order to make the isolation by insulation between the elements more effective, it is required that the element isolation layer be formed on the substrate to project from the side end portion of the common gate electrode layer towards the contact portions of the bit lines. A distance between the side end portion of the common gate electrode layer and the terminal edge of the element isolation layer formed to project therefrom is selected with much care so as to prevent reduction in the field inversion voltage due to the roundabout of an electric field between the adjacent selection transistors. With the distance set larger, the roundabout of an electric field can be more effectively prevented and consequently the more effective element isolation can be attained.

However, increase in the projection distance of the element isolation layer leads to an undesired result of reduction in the junction withstanding voltage. This is because the active layers of the selection transistors and the element isolation layer may be made in electrical contact with each other when the projection end is set excessively near the contact portions of the bit lines. If the projection distance of the element isolation layer and the distance for the junction withstanding voltage are set to respective desired values at the same time, the integration density itself of the memory cell devices is lowered.

SUMMARY OF THE INVENTION

It is therefore an object of this invention to provide a new and improved MOS type semiconductor device which is excellent in the integration density and reliability.

In accordance with the above object, the present invention is addressed to a specific semiconductor device which has an insulative layer section formed above a semiconductive substrate and defining first and second element forming areas on the surface thereof. First and second metal insulator semiconductor transistors are respectively formed on the first and second element forming areas. Each of the transistors has first and second semiconductor layers functioning as the source and drain thereof. Each of the transistors has a contact hole section formed in one of the first and second semiconductor layers. A wiring layer is adopted to be connected to the contact hole section. A heavily doped semiconductor layer is formed beneath the insulative layer section in the substrate to substantially intersect the common gate electrode layer and function as an inversion preventing layer. The heavily doped layer is positioned between the first and second transistors and formed to project from the common gate electrode layer towards the contact hole section. It is very important that the common gate electrode layer has a concave portion in an area in which it intersects the heavily doped layer, whereby an effective projection distance between the front edge of the heavily doped layer facing the contact hole section and the side edge of the common gate electrode layer can be set larger while the linear distance between the front edge of the heavily doped layer and the contact hole section facing thereto is prevented from being less than a previously required value.

The present invention, its objects and advantages will become more apparent in the detailed description of a preferred embodiment presented below.

BRIEF DESCRIPTION OF THE DRAWINGS

In the detailed description of a preferred embodiment of the present invention presented below, reference is made to the accompanying drawings of which:

FIG. 1 is a a diagram schematically showing a plan view of two neighboring cell blocks of electrically erasable programmable read-only memory (EEPROM) according to a preferred embodiment of this invention, each including a selection transistor and memory cell transistors which are series-connected so as to constitute a "NAND cell" structure;

FIG. 2 is a diagram showing a cross-sectional view of the cell block taken along line II—II in FIG. 1;

FIG. 3 is a diagram showing another cross-sectional view of the cell block taken along line III—III in FIG. 1;

FIGS. 6A to 6C are diagrams showing in schematic cross-section some major steps in the process of the FIG. 1 embodiment.

DETAILED DESCRIPTION OF THE PREFERRED EMBODIMENTS

Figure 4:
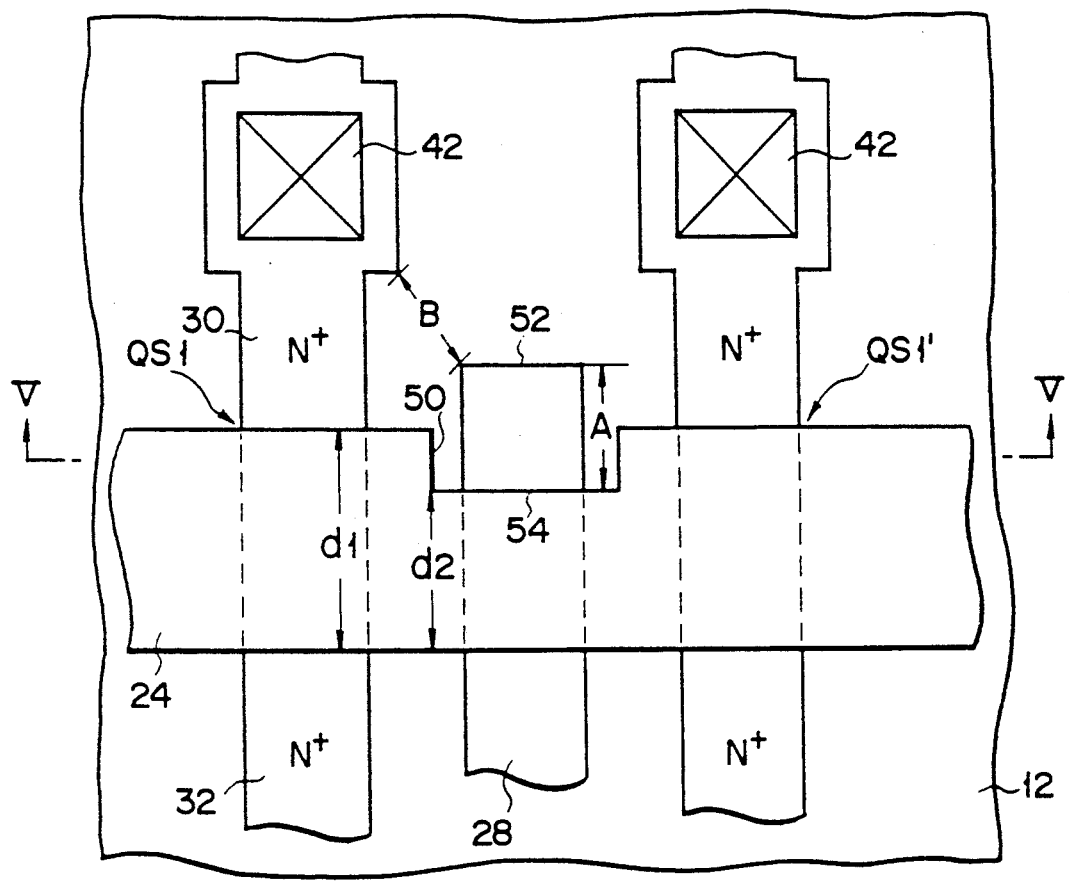
FIG. 4 is a diagram showing an enlarged plan view of the EPROM.

An electrically erasable programmable read only memory (which is hereinafter referred to as "EEPROM" according to the practice of this technical field) according to a preferred embodiment of this invention is generally designated by a reference numeral "10".

The EEPROM 10 has a lightly-doped P conductivity type (P-type) silicon substrate 12, for example. The EEPROM 10 includes a first selected number of parallel bit lines BL1, BL2, .... Each of the bit lines BL is provided with a second selected number of memory cell arrays (which is hereinafter referred to as "NAND cell blocks" or simply as "cell blocks") B. Each of the cell arrays has a third selected number of memory cell transistors M. The cell transistors may be a series connection of double gate type metal oxide semiconductor field effect transistors (MOSFETs), each of which has a control gate and an electrically floating gate serving as a carrier storage layer.

It should be noted that only two neighboring or adjacent bit lines BL1 and BL2 are shown in FIG. 1 for brevity of the drawing. The number of cell transistors provided in each NAND cell block Bi (i=1, 2, ...) is set to 4, for example, although it may be set to "8", "16" or more in actual application. Also, in order to enhance the visual understanding of the plane positional relation between the internal layers of the device 10 which are partly or totally overlapped with each other, the bit line BL2 adjacent to the bit line BL1 is illustrated to be cut out on the half way for convenience so that the plane positional relation between the layers lying under the bit line BL can be easily understood at one view.

Each NAND cell block Bi is connected at one end to a corresponding bit line BLi via a first selection transistor Qs1 and connected at the other end to a heavily-doped N type layer 11 formed as a source layer in a P− type substrate 12, via a second selection transistor Qs2. Each of the selection transistors Qs1 and Qs2 is constructed by a single gate type MOSFET. When the selection transistors Qs1 and Qs2 are rendered conductive, the NAND cell block Bi is electrically connected to the corresponding bit line BLi and a source voltage, thereby permitting data to be sequentially programmed into memory cells M1 to M4 of the NAND cell block Bi.

Referring to the cross-sectional views of FIGS. 2 and 3, the NAND cell transistor array of each NAND cell block Bi is formed in a substrate surface area surrounded by an insulative layer 14 which is formed for element isolation on the P− type silicon substrate 12. The surface area is generally called an element forming area. As is most clearly shown in FIG. 2, the MOSFET M1 constituting one memory cell (like the other MOSFETs constituting other memory cells) has a first polysilicon layer 16 insulatively disposed above the substrate 12 via a thermal oxide film 18 and a second polysilicon layer 20 insulatively disposed above the layer 16 via a thermal oxide insulative layer 22. The first polysilicon layer 16 serves as the afore-mentioned floating gate of a MOSFET Mi, whereas the second polysilicon layer 20 serves as a control gate of the MOSFET Mi (i=1, 2, ...).

As shown in FIG. 1, the control gate 20 is continuously formed to extend in a direction intersecting the bit lines BL to form a word line (for example, word line WL1 for the memory cell M1). The selection transistor Qs1 has a polysilicon layer 24 insulatively disposed above the substrate 12. The polysilicon layer 24 serves as a control gate SD of the selection transistor. The selection transistor Qs2 may be formed with the same construction as the transistor Qs1. However, a control gate electrode of the second transistor Qs2 is designated by a reference symbol "SS".

As shown in FIG. 2, the floating gate 16 is formed to extend to the element isolation insulative layer 14, whereby the coupling capacitance Cfs between the floating gate 16 and the substrate 12 is set to be smaller than the coupling capacitance Ccs between the floating gate 16 and the control gate 20 in each memory cell Mi so that data programming/reading operation can be effected only by movement of charges (electrons) due to the tunneling effect between the floating gate 16 and the substrate 12.

A P type semiconductor layer 26 is formed beneath the element isolation insulative layer 14 in the substrate 12. The P-type semiconductor layer 26 is formed in contact with the bottom portion of the element isolation insulative layer 14. A heavily-doped P type (P+ type) semiconductor layer 28 is formed by partially doping P type impurity into the layer 26. Also, the semiconductor layer 28 is formed in direct contact with the bottom portion of the element isolation insulative layer 14. The layers 26 and 28 serve as an inversion prevention layer section.

As shown in FIG. 3, heavily-doped N type (N+ type) diffusion layers 30, 32, 34, 36, 38, ... are formed in the surface area of the substrate 12 to only slightly overlap with the transistors Qs and M. The N+ type diffusion layers serve as the sources and drains of corresponding transistors. For example, the N+ type diffusion layers 30 and 32 respectively serve as the source and drain of the selection transistor Qs1. Likewise, the N+ type diffusion layers 32 and 34 respectively serve as the source and drain of the cell transistor M1.

The above semiconductor structure is entirely covered with a CVD insulative layer 40. A bit line contact hole 42 is formed in the CVD insulative layer 40. An aluminum connection wiring 44 is formed on the insulative layer 40 to extend along the series connection of the transistors Qs and M and substantially overlap with the gates of the transistors Qs and M arranged in the cell block B1. The contact hole 42 is positioned on the drain diffusion layer 30 of the selection transistor Qs1. The connection wiring 44 is electrically connected to the drain of the selection transistor Qs1 via the contact hole 42 and used as the bit line BL1 of the NAND cell array. Since the construction of the NAND cell block B2 provided for the other bit line BL2 is the same as described above and a redundant explanation therefor is omitted only for saving space.

It is very important that the selection gate electrode layer 24 has a concave portion or cut-away portion 50 as shown in FIG. 1. For example, the concave portion 50 takes a rectangular form. The concave portion 50 is disposed above the P+ type inversion prevention layer 28 on the element isolation area between the two neighboring NAND cell blocks Bl and B2. As is clearly shown by the partly enlarged plan view of FIG. 4, the width of that portion of the selection gate layer 24 which is narrowed by the concave portion 50 is indicated by d2 when the width of the selection gate layer 24 (that is, the channel length of the selection transistor) is expressed by d1. In FIG. 4, the bit lines BL1 and BL2 are omitted for convenience in order to attain the clear understanding.

Figure 5:
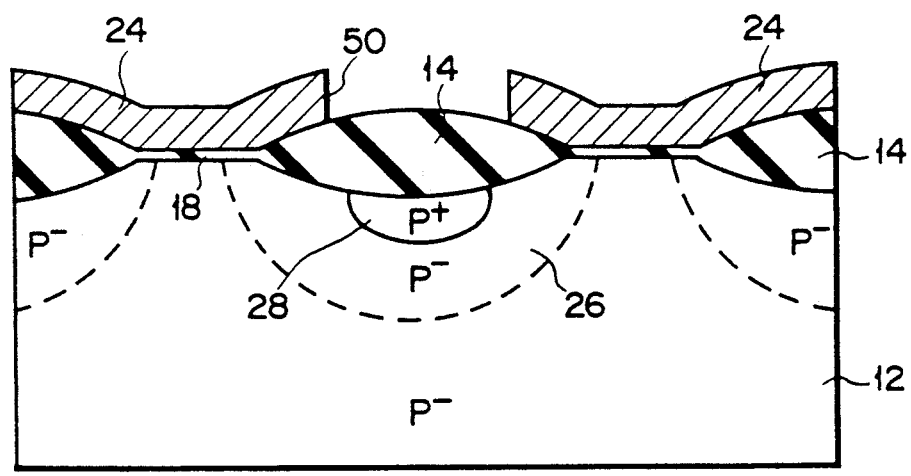
FIG. 5 is a diagram showing another cross-sectional view of the cell block taken along line V—V in FIG. 4.

As shown in FIGS. 4 and 5, the underlying P type inversion prevention layer 28 is formed to project from the selection gate layer 24 towards the bit line contact hole 42. A distance between the top end (or front end) 52 of the inversion prevention layer 28 and a side edge 54 defined by the concave portion 50 of the selection gate layer 24 is expressed by "A". Further, a distance between one of the corners of the inversion prevention layer 28 and the opposing corner of the N+ type layer 30 formed in contact with the contact hole 42 is expressed by "B". With such a projection of the inversion prevention layer 28, the interference or reduction in the roundabout of the electric field between the selection transistors Qs of the adjacent NAND cell blocks Bl and B2 can be minimized and the element isolation ability of the device can be enhanced.

Careful attention should be paid to the fact that formation of the concave portion 50 in the selection gate layer 24 permits the effective projection distance A of the inversion prevention layer 28 to be maximized without increasing a separation distance (which may also be referred to as "opposition distance" or "junction withstanding voltage distance") from the contact hole B. This resolves the conventional conflicting problems: it produces a fruitful result that an EEPROM formed with high integration density can be attained which can enhance the inversion voltage of the field between adjacent MOSFETs while a junction withstanding voltage between the N+ type layer 30 and the inversion prevention layer 28 is kept at an adequate value.

In an actual application, if the width d2 of that portion of the selection gate layer 24 which is narrowed by the concave portion 50 is not less than a common value (2 micrometers, or 1 micrometer in near future) according to the general patterning design rule in the present situation, the concave portion 50 can be easily formed without using a special micro-fabrication manufacturing process. In general, the width d1 of the selection gate layer 24 is formed larger than 2 micrometers for the following reason: it is strongly required in this type of EEPROM to ensure a high punchthrough withstanding voltage in the selection transistors Qsl near the bit lines BL in comparison with the memory cell transistors M in a case where a high voltage is applied to the bit lines BL in the data programming and/or erasing mode. Accordingly, formation of the concave portion 50 in the selection gate layer 24 will not produce an problem in the present processing technical level.

There will now be described a method for manufacturing the above selection gate layer 24 having the concave portion 50 with reference to FIGS. 6A to 6C. As shown in FIG. 6A, a thermal oxide film 60 is formed to a thickness of approx. 50 nm on the P− type silicon substrate 12, and a nitride film 62 serving as an anti-oxidation mask is disposed o the film 60 by the LOCOS method and is then patterned. After this, B+ is ion-implanted into the element isolation area of the substrate 12 with the nitride film 62 used as a mask. For example, the ion-implantation is effected at an acceleration voltage of 100 KeV and with a dose amount of $7E12/cm^2$ to form a B ion-implanted region 26' of relatively low impurity concentration. Then, a photoresist mask layer 64 having an opening 66 only in a portion corresponding to the central portion of the element isolation area is formed and B+ is ion-implanted again. At this time, the ion-implanting process is effected under a condition that the acceleration voltage is set at 100 KeV and the dose amount is set at $3E13/cm^2$ so as to form a B ion-implanted layer 28' of high impurity concentration (FIG. 6A).

After the photoresist layer 64 is removed, hydrogen-burning oxidation process is effected at 100020 C. to form an element isolation insulative layer 14 of approx. 850 nm and then the nitride film used as the anti-oxidation mask is removed as shown in FIG. 6B. In this step, the ion-implanted impurity is activated to form a P type layer 26 and P+ type layer 28.

Subsequently, a gate insulative layer 18 formed of a thermal oxide film of approx. 430 nm is formed by HCl-oxidation at 900° C. and a polysilicon film is disposed on the insulative layer 18 by the CVD process. Then, a heat treatment is effected at 900° C. for 30 minutes in an atmosphere of gas containing $POCl_3$ to diffuse phosphorus into the polysilicon film. After this, the polysilicon film is patterned to form a gate electrode 24 as shown in FIG. 6C.

The operation of the EEPROM of the above embodiment is explained below in consideration of the NAND cell section BL1 formed of M1 to M4 shown in FIG. 1. Data programming and erasing operations are effected by transferring electrons between the floating gate and the substrate of each memory cell by use of the F-N tunneling effect. For example, the data erasing operation is effected by applying a high voltage of approx. 20 V to all the word lines WL1 to WL4 and selection gate lines SD and SS and setting the bit lines to 0 V to inject electrons from the substrates into the floating gates in all the memory cells constituting the NAND cell. In this way, the memory cell may be set into the erasing state in which the threshold voltage thereof is shifted in a positive direction. The data programming operation is sequentially effected starting from the memory cell M4 which is located in a position farthest from the bit line. The operation of programming data into the memory cell M4 is effected by setting the selection word line WL4 to 0 V, applying a high voltage of approx. 20 V to all the word lines WL1 to WL3 which are nearer to the bit lines than the selection word line WL4 and the selection gate line SD and applying a high voltage of approx 20 V to the bit line. In the data programming operation, electrons in the floating gate of the memory cell M4 are emitted into the substrate, thus setting up a state in which the threshold voltage thereof is shifted in a negative direction. Likewise, the data programming operation is sequentially effected in the same manner by sequentially setting the word lines WL3, WL2, ... to 0 V. The data readout operation is effected by applying a readout voltage of approx. 5 V to the selection word line, applying an intermediate potential to the word lines which lie nearer to the bit line than the above selection word line and the selection gate lines SD and SS, applying a voltage of approx. 1 V to the bit line and detecting whether a current flows or not.

This invention should not be limited to the above embodiment only. For example, in the above embodiment, the concave portion formed in the gate electrode wiring is formed in a rectangular pattern, it may be formed in any pattern such as a semi-circular or "V"-shaped pattern which permits one side of the gate electrode to be retarded on the element isolation area. Further, in the above embodiment, this invention is applied to the NAND cell type E²PROM, but it can be applied to another type of E²PROM or EPROM, or all the MOS type integrated circuits having a structure in which MOS transistors are arranged adjacent to each other and formed to have a common gate electrode.

What is claimed is:

1. An erasable programmable read-only memory device comprising:
   (a) a semiconductive substrate;
   (b) parallel bit lines disposed above said substrate;
   (c) parallel word lines disposed above said substrate to intersect said bit lines;
   (d) double gate field effect transistors disposed at intersections between said bit lines and said word lines and functioning as memory cells of said device, said transistors including two adjacent cell arrays each of which has a series-circuit of cell transistors for constituting a NAND cell structure, each of said cell transistors having an electrically floating gate and a control gate which is connected to a corresponding word line;
   (e) field effect transistors respectively provided for said cell arrays, each having a gate and functioning as a switching transistor for selectively coupling a cell array at opposite ends of said cell array to a corresponding one of said bit lines and a substrate potential, respectively,
   said switching transistors having a conductive layer formed to extend in parallel with said word line serving as a common control gate electrode thereof;
   (f) a heavily doped semiconductive inversion prevention layer disposed between said switching transistors, for suppressing interference between said switching transistors,
   said inversion prevention layer insulatively intersecting said common gate electrode with a front edge thereof being projected from a side end of said common electrode; and
   (g) said common gate electrode having a reduced width in an area of intersection with said inversion prevention layer, thereby increasing a substantial projection distance of said inversion prevention layer.

2. The device according to claim 1, wherein said common gate electrode has a concave portion on a side peripheral portion of the area of intersection with said inversion prevention layer.

3. The device according to claim 2, wherein said common gate electrode is patterned so that said concave portion is formed in a rectangular pattern having a width larger than the width of said inversion prevention layer.

* * * * *